(12) United States Patent
Kesler et al.

(10) Patent No.: US 12,332,561 B2
(45) Date of Patent: Jun. 17, 2025

(54) EMITTER OXIDATION UNIFORMITY WITHIN A WAFER

(71) Applicant: Lumentum Operations LLC, San Jose, CA (US)

(72) Inventors: Benjamin Kesler, Sunnyvale, CA (US); Ajit Vijay Barve, San Jose, CA (US); Guowei Zhao, Milpitas, CA (US)

(73) Assignee: Lumentum Operations LLC, San Jose, CA (US)

( * ) Notice: Subject to any disclaimer, the term of this patent is extended or adjusted under 35 U.S.C. 154(b) by 827 days.

(21) Appl. No.: 17/648,012

(22) Filed: Jan. 14, 2022

(65) Prior Publication Data

US 2022/0140573 A1 May 5, 2022

Related U.S. Application Data

(62) Division of application No. 16/244,842, filed on Jan. 10, 2019, now Pat. No. 11,239,638.

(60) Provisional application No. 62/726,815, filed on Sep. 4, 2018.

(51) Int. Cl.
G03F 1/00 (2012.01)
G03F 1/50 (2012.01)

(52) U.S. Cl.
CPC . *G03F 1/50* (2013.01); *G03F 1/00* (2013.01)

(58) Field of Classification Search
CPC .................................... G03F 1/00; G03F 1/50
USPC ............................................................. 430/5
See application file for complete search history.

(56) References Cited

U.S. PATENT DOCUMENTS

| 8,265,115 B2 | 9/2012 | Ikuta |
| 10,170,889 B1 | 1/2019 | Yuen |
| 2004/0120376 A1 | 6/2004 | Kwak |
| 2006/0286692 A1 | 12/2006 | Nagawa et al. |
| 2008/0233017 A1 | 9/2008 | Sato et al. |
| 2009/0268774 A1 | 10/2009 | Oki et al. |
| 2009/0295902 A1 | 12/2009 | Sato et al. |
| 2011/0316961 A1 | 12/2011 | Hanaoka |
| 2017/0353012 A1 | 12/2017 | Barve et al. |
| 2019/0267778 A1 | 8/2019 | Lou et al. |
| 2020/0076166 A1 | 3/2020 | Kesler et al. |
| 2020/0358252 A1 | 11/2020 | Hoser et al. |

FOREIGN PATENT DOCUMENTS

CN 101986488 A 3/2011

*Primary Examiner* — Christopher G Young
(74) *Attorney, Agent, or Firm* — Harrity & Harrity, LLP (57) ABSTRACT

A wafer may comprise a substrate layer and a plurality of vertical cavity surface emitting lasers (VCSELs) formed on or within the substrate layer. A respective trench-to-trench distance associated with the plurality of VCSELs may vary across the wafer based on a predicted variation of an oxidation rate of an oxidation layer across the wafer.

20 Claims, 5 Drawing Sheets

EMITTER OXIDATION UNIFORMITY WITHIN A WAFER

RELATED APPLICATIONS

This application is a division of U.S. patent application Ser. No. 16/244,842, filed Jan. 10, 2019, which claims priority under 35 U.S.C. § 119 to U.S. Provisional Patent Application No. 62/726,815, filed on Sep. 4, 2018. The contents of both applications are incorporated herein by reference in their entireties.

TECHNICAL FIELD

The present disclosure relates to a wafer and, more particularly, to improving emitter oxidation uniformity within a wafer.

BACKGROUND

In a semiconductor laser, optical gain is produced in a semiconductor material. The choice of material may depend on a desired wavelength and/or properties of a generated optical beam. In some cases, the gain medium may include, for example, a quantum heterostructure, a double heterostructure, a quantum well, a quantum wire, a quantum dot, and/or the like. A semiconductor laser may include one or more multi-layer structures.

SUMMARY

According to some possible implementations, a wafer may comprise: a substrate layer, a plurality of vertical cavity surface emitting lasers (VCSELs) formed on or within the substrate layer, wherein a respective trench-to-trench distance associated with the plurality of VCSELs varies across the wafer based on a predicted variation of an oxidation rate of an oxidation layer across the wafer.

According to some possible implementations, a wafer may comprise: a substrate layer, a plurality of vertical cavity surface emitting lasers (VCSELs) formed on or within the substrate layer, wherein a respective mesa size of the plurality of VCSELs varies across the wafer relative to a predicted oxidation rate of an oxidation layer across the wafer.

According to some possible implementations, a mask may comprise: a plurality of sub-masks having trench features associated with forming a plurality of trenches for vertical cavity surface emitting lasers (VCSELs) on or within a wafer, wherein a distance between the trench features in the plurality of sub-masks is constant, and wherein the distance between the trench features of at least one sub-mask, of the plurality of sub-masks, is different from one or more other sub-masks, of the plurality of sub-masks, based on a predicted variation in an oxidation rate of an oxidation layer associated with the wafer.

According to some possible implementations, a mask may comprise: a plurality of trench features associated with forming a plurality of trenches for vertical cavity surface emitting lasers (VCSELs) on or within a wafer, wherein a distance between the plurality of trench features varies across the mask based on a predicted variation in an oxidation rate of an oxidation layer associated with the wafer.

DETAILED DESCRIPTION

The following detailed description of example implementations refers to the accompanying drawings. The same reference numbers in different drawings may identify the same or similar elements.

An in-the-field performance of three-dimensional (3D) sensing technology based on an emitter array may be highly dependent on a size of a respective oxide aperture (e.g., a current confinement aperture) of emitters of the emitter array. To meet functional performance needs of the emitter array, there is typically a range of oxide aperture sizes for the oxide apertures of the emitters. Any deviation from this range can lead to yield loss at a wafer-level, a module-level, and/or across a device operating lifetime. An oxidation rate varies across a wafer due to variations of an epitaxial growth process (e.g., due to a thickness and composition of an oxidation layer varying across the wafer) or the fabrication processes (e.g., due to a non-uniformity of the temperature inside the oxidation furnace across the wafer surface). The variation in oxidation rates can cause a respective oxide aperture of emitters formed on a wafer to have different diameters. In some cases, the variation may cause a diameter of an oxide aperture to be outside of an acceptable range, resulting in loss of emitter performance, a shortened useful life of an emitter array that includes the emitters, and/or the like. While the difference in oxidation rates can be reduced by careful, extensive, and costly process calibrations, the differences cannot be eliminated entirely.

Some implementations described herein reduce an oxidation aperture size variation across a wafer by using trench (or mesa) etch photomasks during wafer fabrication to compensate for different oxidation rates across the wafer (e.g., to compensate for predicted variations in an oxidation rate, for predicted oxidation rates, and/or the like). For example, some implementations described herein compensate for different oxidation rates based on historical data, regardless of the cause of the oxidation rate difference, by varying a trench-to-trench distance (or mesa diameter) between each photomask, and/or the like. In this way, some implementations described herein improve across-wafer uniformity of a size of an oxide aperture of a wafer by modifying a trench-to-trench (T2T) distance and/or mesa size of emitters depending on a location of the emitters on the wafer to compensate for location-specific oxidation rate differences. This reduces or eliminates loss of emitters associated with variations in oxide aperture diameter resulting from variations in an oxidation rate across a wafer during production of the emitters, thereby improving output from production of the emitters, conserving costs caused by the loss, and/or the like. In addition, this reduces or eliminates a need for process calibration of production of the emitters, thereby conserving time and/or costs associated with the process calibration. Further, this improves a quality of emitters by reducing variation in oxide aperture diameter across a wafer, thereby improving a quality and/or functioning of a resulting emitter array that includes the emitters, or a device that includes the emitter array.

Figure 1:
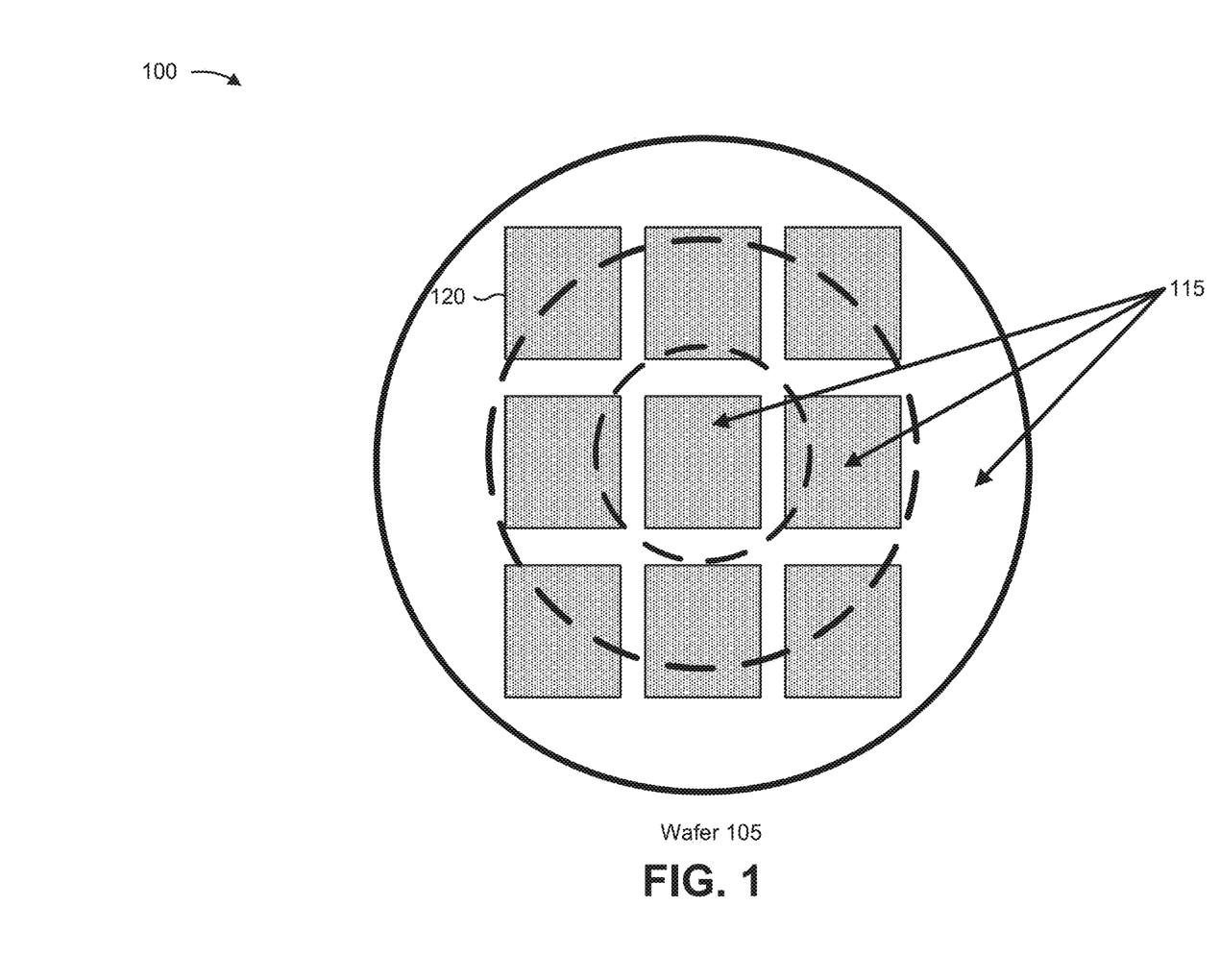
FIG. 1 is a diagram of an example implementation described herein.

FIG. 1 is a diagram of an example implementation 100 described herein. As shown in FIG. 1, implementation 100 includes a wafer 105. For example, wafer 105 may be a wafer that is to be used to produce integrated circuits, chips, semiconductor lasers, and/or the like. As further shown in FIG. 1, wafer 105 may include a set of die 120 (not shown to scale). For example, emitters may be formed on die 120 in a manner similar to that described elsewhere herein to form an emitter array. In some implementations, an emitter may include a light-emitting diode (LED), a vertical cavity surface emitting laser (VCSEL), a vertical external cavity surface emitting laser (VECSEL), a laser, a light-emitting device, and/or the like. In some implementations, emitters on die 120 may be arranged in a regular two-dimensional pattern. Conversely, in some implementations, emitters on die 120 may be arranged in a random pattern, a semi-random pattern (e.g., where some of the emitters are arranged in a regular two-dimensional pattern and others are arranged in a random two-dimensional pattern), and/or the like. Some implementations may be described in the context of a trench, which may include an etch into an epitaxial layer of wafer 105 to expose an oxidation layer of wafer 105 for a wet oxidation process. Additionally, or alternatively, some implementations may be described in the context of a mesa, which may include a structure of an emitter that remains after an approximately 360-degree removal of epitaxial layers around the emitter to expose an oxidation layer of the emitter (e.g., from all sides).

As shown by reference number 115, wafer 105 may include regions that are associated with different oxidation rates of an oxidation process (e.g., a wet oxidation process, a dry oxidation process, and/or the like) during the production process of emitters on die 120. For example, and as shown in FIG. 1, wafer 105 may have three concentric regions, where the oxidation rate varies across the three concentric regions. Continuing with the previous example, the variation in oxidation rates, if uncompensated during the production process, may cause emitters formed to have different diameter oxide apertures, which may cause various performance issues for the emitters, an emitter array that includes the emitters, a device that includes the emitter array, and/or the like.

In some implementations, and as described elsewhere herein, one or more masks (e.g., photolithography masks or photomasks used in a lithography process) may be used during the production process to compensate for these variations in the oxidation rate. For example, the one or more masks may include variations in trench features to modify, across wafer 105, a trench-to-trench distance (or a diameter of a mesa structure) associated with emitters formed on wafer 105. As a specific example, a stepper mask that includes various sub-masks with differently configured trench features may be used for different regions of wafer 105 to obtain variation in oxide aperture diameter across wafer 105 (e.g., to compensate for variations in the oxidation rate across wafer 105). Continuing with the previous specific example, and referring to FIG. 1, a first sub-mask with a first configuration of trench features may be used for the region of wafer 105 corresponding to a first oxidation rate (e.g., the region corresponding to the center of wafer 105). Continuing still with the previous specific example, a second sub-mask with a second configuration of trench features may be used for the next concentric region (e.g., with a second oxidation rate) and a third sub-mask with a third configuration of trench features may be used for the region closest to an edge of wafer 105 (e.g., with a third oxidation rate).

As another specific example, a contact mask that includes similar variations in a configuration of trench features across the contact mask may be used to compensate for variations in the oxidation rate across wafer 105. For example, rather than using different sub-masks that have different configurations of trench features, the contact mask may be a single mask that includes a gradient of variations in the trench features across the contact mask.

In this way, a mask (e.g., with or without sub-masks) may be used to obtain a variation in an oxide aperture diameter across wafer 105. For example, the mask may include variations in trench features across the mask, such that the mask forms differently sized trenches and/or mesa structures of emitters associated with wafer 105. This can compensate for variations in an oxidation rate across wafer 105, thereby facilitating more uniform oxide aperture diameters across wafer 105 (e.g., which can improve a quality of emitter arrays formed on wafer 105 and/or devices that include the emitter arrays). In addition, compensating for variations in an oxidation rate across wafer 105 in this manner reduces or eliminates a need for process calibration prior to forming emitters on wafer 105, thereby conserving resources that would otherwise be consumed performing the process calibration. Similarly, by compensating for variations in an oxidation rate via the mask rather than the production process, the variations can be compensated for more accurately, more easily, and more cheaply.

As indicated above, FIG. 1 is provided merely as an example. Other examples are possible and may differ from what was described with regard to FIG. 1.

Figure 2A:
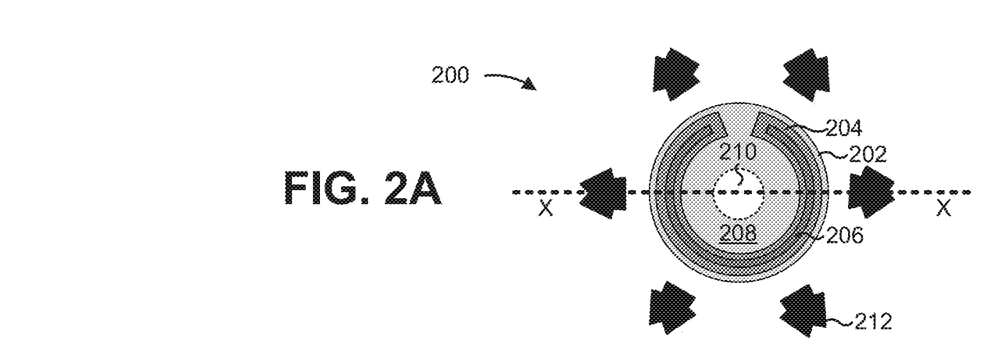
FIGS. 2A and 2B are diagrams depicting a top-view of an example vertical-emitting device and a cross-sectional view of the example vertical-emitting device, respectively.
Figure 2B:
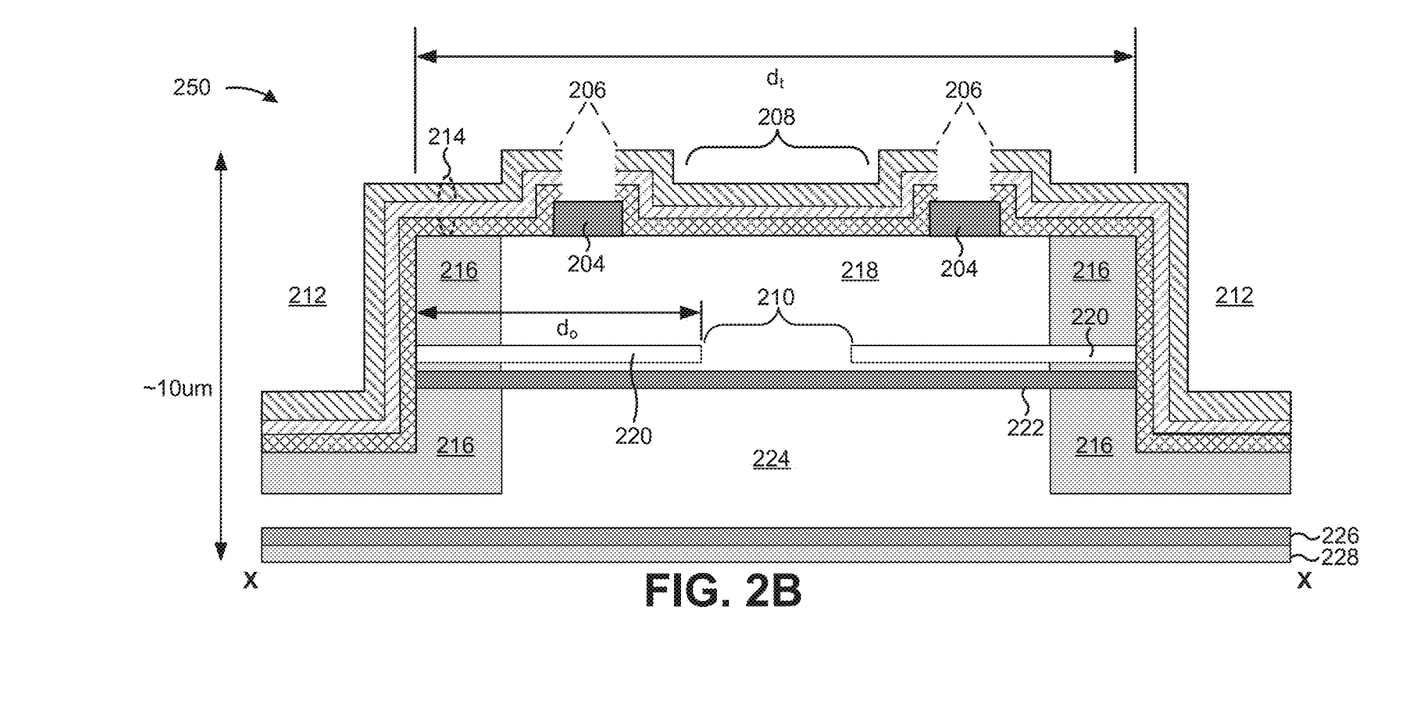

FIGS. 2A and 2B are diagrams depicting a top-view of an example emitter 200 and a cross-sectional view 250 of example emitter 200, respectively. As shown in FIG. 2A, emitter 200 may include a set of emitter layers constructed in an emitter architecture. In some implementations, emitter 200 may correspond to one or more vertical-emitting devices described herein.

As shown in FIG. 2A, emitter 200 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 200 (not shown). As shown by the medium gray area in FIG. 2A, emitter 200 includes a P-Ohmic metal layer 204 that is constructed in a partial ring-shape (e.g., with an inner radius and an outer radius). As shown, P-Ohmic metal layer 204 is positioned concentrically over implant protection layer 202 (i.e., the outer radius of P-Ohmic metal layer 204 is less than or equal to the radius of implant protection layer 202). Such configuration may be used, for example, in the case of a P-up/top-emitting emitter 200. In the case of a bottom-emitting emitter 200, the configuration may be adjusted as needed.

As further shown in FIG. 2A, emitter 200 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed concentrically over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, emitter 200 includes an optical aperture 208 in a portion of the emitter within the inner radius of the partial ring-shape of P-Ohmic metal layer 204. Emitter 200 emits a laser beam via optical aperture 208. As further shown, emitter 200 also includes a current confinement aperture 210 (e.g., an oxide aperture formed by an oxidation layer of emitter 200 (not shown)). Current confinement aperture 210 is formed below optical aperture 208.

As further shown in FIG. 2A, emitter 200 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 includes a set of six oxidation trenches 212, in practice, other designs are possible, such as a compact emitter that includes five oxidation trenches 212, seven oxidation trenches 212, and/or the like. As another example, while emitter 200 is a circular emitter design, in practice, other designs are possible, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

Notably, while the design of emitter 200 is described as including a VCSEL, other implementations are possible. For example, the design of emitter 200 may apply in the context of another type of optical device, such as a light emitting diode (LED), or another type of vertical emitting (e.g., top emitting or bottom emitting) optical device. Additionally, the design of emitter 200 may apply to emitters of any wavelength, power level, emission profile, or the like. In other words, emitter 200 is not particular to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active region 222, an oxidation layer 220, a top mirror 218, an implant isolation material 216, a dielectric passivation/mirror layer 214, and a P-Ohmic metal layer 204. As shown, emitter 200 may have a total height that is approximately 10 µm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like.

Bottom mirror 224 may include a bottom reflector layer of emitter 200. For example, bottom mirror 224 may include a distributed Bragg reflector (DBR).

Active region 222 may include a layer that confines electrons and defines an emission wavelength of emitter 200. For example, active region 222 may be a quantum well.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed.

Current confinement aperture 210 may include an optically active aperture defined by oxidation layer 220. A size of current confinement aperture 210 may range, for example, from approximately 6.0 µm to approximately 14.0 µm. In some implementations, a size of current confinement aperture 210 may depend on a distance between oxidation trenches 212 that surround emitter 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as do in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of emitter 200. For example, top mirror 218 may include a DBR.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a SiO2 layer, a Si3N4 layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bond pad (not shown) that contacts P-Ohmic metal layer 204 through dielectric via openings 206).

In some implementations, emitter 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, or differently arranged layers than those shown in FIG. 2B. Additionally, or alternatively, a set layers (e.g., one or more layers) of emitter 200 may perform one or more functions described as being performed by another set of layers of emitter 200.

Figure 3:
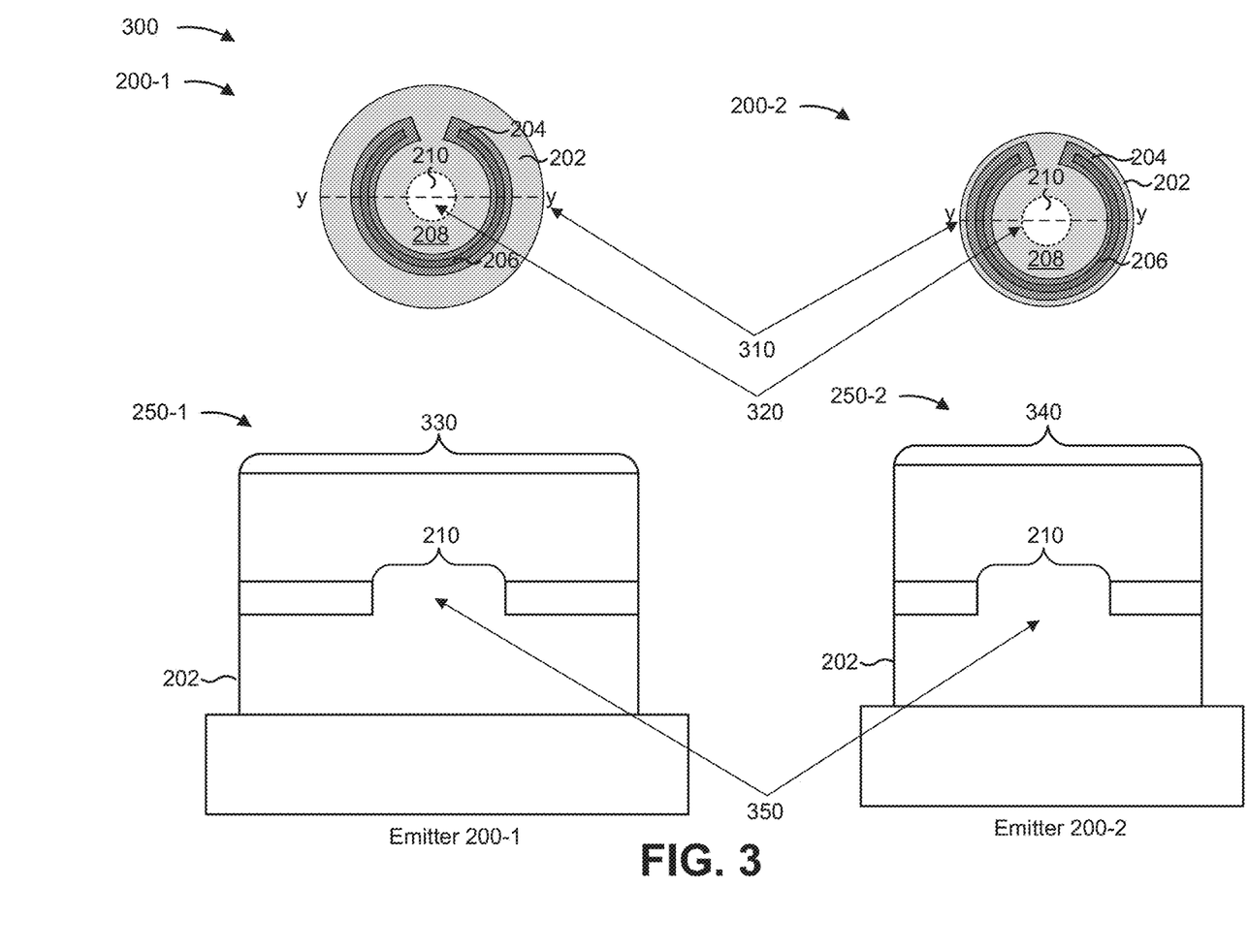
FIG. 3 is a diagram of an example implementation related to emitters associated with a wafer described herein.

FIG. 3 is a diagram of an example implementation 300 related to emitters associated with a wafer described herein. As shown in FIG. 3, implementation 300 includes a top-view and a cross-sectional view of an emitter 200-1 and a top-view and a cross-sectional view of an emitter 200-2. The top-views and the cross-sectional views may not be shown to scale with each other. For FIG. 3, assume that emitter 200-1 and emitter 200-2 are located in different regions of wafer 105 that have different oxidation rates. In some implementations, emitters 200-1 and 200-2 may be associated with a same die 120 or with different die 120 of wafer 105.

As shown by reference number 310, emitters 200-1 and 200-1 may have different trench-to-trench distances (y-y distances) (e.g., different diameters of implant protection layer 202). For example, emitters 200-1 and 200-2 may have different trench-to-trench distances based on having different sized mesa structures, based on being associated with trenches (e.g., oxidation trenches 212) of different widths, and/or the like. In some implementations, the different trench-to-trench distances of emitter 200-1 and emitter 200-2 may be based on different oxidation rates at a respective location of emitters 200-1 and 200-2 on wafer 105. For example, emitter 200-1 may have a larger trench-to-trench distance than emitter 200-2 based on being at a location on wafer 105 that has a higher oxidation rate than a location of emitter 200-2 on wafer 105 (e.g., a trench-to-trench distance may be correlated with an oxidation rate).

In some implementations, and as described elsewhere herein, the oxidation rates may be historical oxidation rates observed in previously processed wafers 105. For example, data related to oxidation rates for a particular oxidation furnace, manufacturer, supplier of wafer 105, and/or the like can be compiled over time and can be used to determine a manner in which to vary a trench-to-trench distance of emitters 200 across wafer 105.

As shown by reference number 320, despite the different trench-to-trench distances of emitters 200-1 and 200-2, emitters 200-1 and 200-2 may have current confinement apertures 210 (e.g., oxide apertures) that have a similar diameter (e.g., are within a threshold percentage size of each other, are within a pre-defined range of values, and/or the like). For example, emitters 200-1 and 200-2 may have similarly sized current confinement apertures 210 based on having been formed with different trench-to-trench distances prior to oxidation. As a result, differences in oxidations rates across wafer 105 may be compensated for or reduced by the different trench-to-trench distances such that after oxidation is complete, emitters 200-1 and 200-2 have similarly sized current confinement apertures 210.

As shown by reference numbers 330 and 340, and with respect to cross-sectional views 250-1 and 250-2, the mesa structures of emitters 200-1 and 200-1 have different diameters. As shown, emitter 200-1 has wider diameter mesa structure than emitter 200-2. For example, emitter 200-1 may have a wider trench-to-trench distance than emitter 200-2. In some implementations, emitters 200-1 and 200-2 may have different trench-to-trench distances based on usage of one or more masks with variations in trench features across the one or more masks.

As shown by reference number 350, despite having different sized mesa structures, emitter 200-1 and emitter 200-2 may have current confinement apertures 210 that have approximately the same diameter (e.g., within 40 microns of each other, within 10 microns of each other, and/or the like). For example, emitters 200-1 and 200-2 may have current confinement apertures 210 with approximately the same diameter based on the different trench-to-trench distances between emitter 200-1 and emitter 200-2 compensating for variations in an oxidation rate across wafer 105 on which emitter 200-1 and emitter 200-2 are formed. This facilitates more uniform light emission from emitters 200 of an array, from emitters 200 formed on a same wafer 105, and/or the like.

As indicated above, FIG. 3 is provided merely as an example. Other examples are possible and may differ from what was described with regard to FIG. 3. The number, arrangement, thicknesses, order, symmetry, or the like, of layers shown in FIG. 3 is provided as an example. In practice, emitter 200 may include additional layers, fewer layers, different layers, differently constructed layers, or differently arranged layers than those shown in FIG. 3. Additionally, or alternatively, a set layers (e.g., one or more layers) of emitter 200 may perform one or more functions described as being performed by another set of layers of emitter 200.

Figure 4:
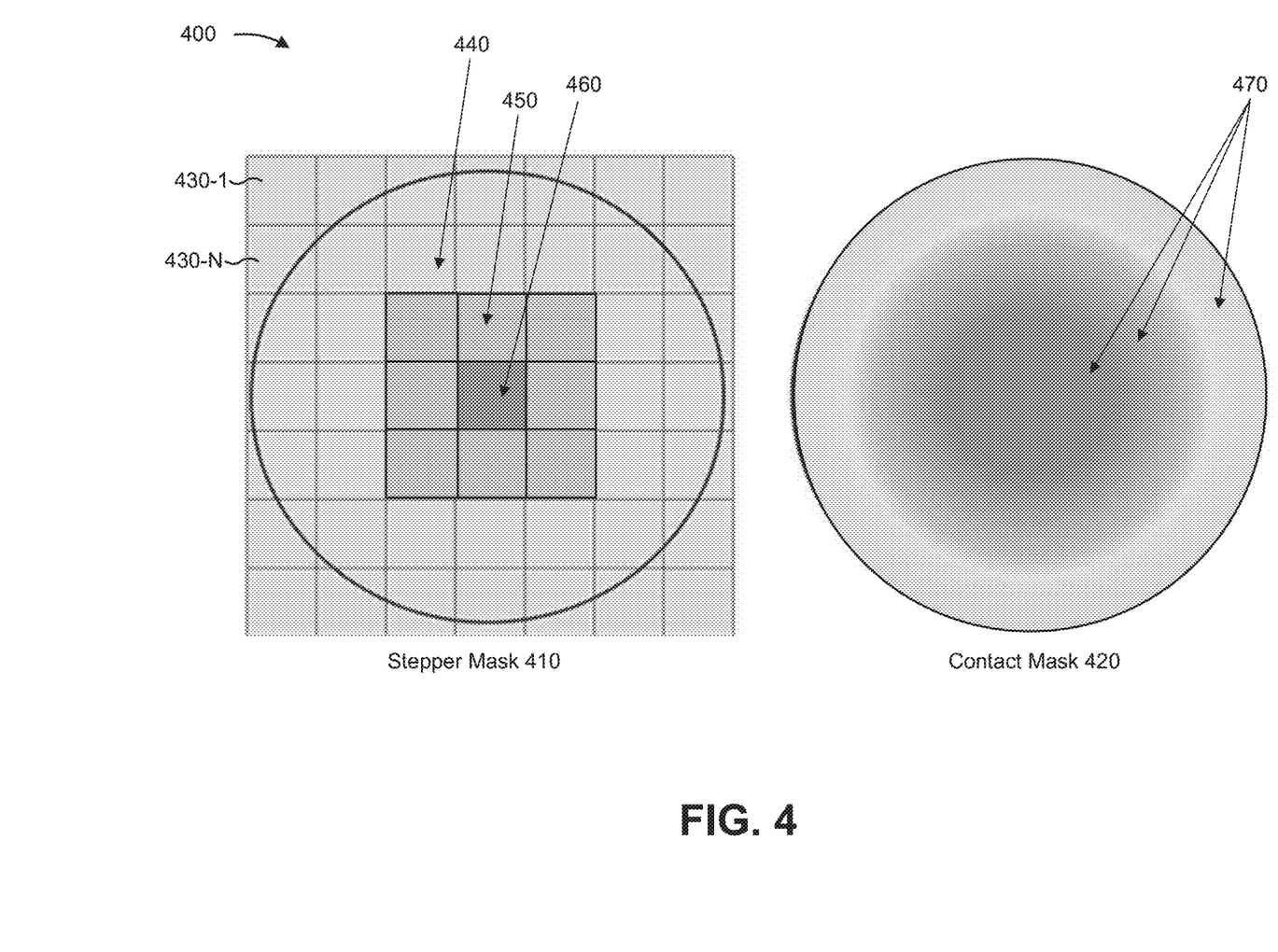
FIG. 4 is a diagram of an example implementation related to masks used to form emitters associated with a wafer described herein.

FIG. 4 is a diagram of an example implementation 400 related to masks used to form emitters associated with a wafer described herein. As shown in FIG. 4, implementation 400 includes a stepper mask 410 and a contact mask 420. In some implementations, stepper mask 410 and/or contact mask 420 may be used to form emitters 200 on wafer 105. For example, stepper mask 410 and/or contact mask 420 may include trench features that are used to form trenches (e.g., oxidation trenches 212) or mesa structures of emitters 200 on wafer 105.

In some implementations, and as shown by reference numbers 430-1 through 430-N, stepper mask 410 may be divided into various steps (shown as squares associated with stepper mask 410) for which a sub-mask is to be used to form trenches and/or mesa structures on wafer 105. For example, a sub-mask may be used to form trenches and/or mesa structures on wafer 105. As shown by reference numbers 440 through 460, different sub-masks may be used for different steps associated with stepper mask 410 (e.g., shown by the light gray, medium gray, and dark gray squares). For example, the different sub-masks may include different configurations of trench features (e.g., different distances between trench features) to be used to form trenches and/or mesa structures on wafer 105 (e.g., shown by the circle). Continuing with the previous example, the different sub-masks may include different configurations of trench features to be used to form emitters 200 with different trench-to-trench distances and/or different diameters of mesa structures.

In some implementations, the different sub-masks may include different configurations of trench features to compensate for variations in oxidation rates across wafer 105 in a manner similar to that described elsewhere herein (e.g., the distance between trench features may be correlated with an oxidation rate across a wafer, such that the distance is greater or less for higher or lower oxidation rates, respectively). For example, sub-masks with different configurations of trench features may be used for different portions of wafer 105 to compensate for different oxidation rates at the different portions, such that emitters 200 formed on wafer 105 have current confinement apertures 210 with approximately the same diameter. In this way, different sub-masks of stepper mask 410 may be used to compensate for variations in an oxidation rate across wafer 105.

In some implementations, a distance between trench features may be constant for a sub-mask. For example, within the sub-mask, the distance between trench features may not vary. However, in some implementations, the distance between trench features of different sub-masks may vary. For example, a first sub-mask may have a first distance between trench features, and a second sub-mask may have a second distance between trench features that is different from the first distance.

Turning to contact mask 420, contact mask 420 may include a single mask where a configuration of trench features (e.g., a distance between trench features) varies across contact mask 420 (e.g., compared to stepper mask 410 that included a plurality of sub-masks with different configurations of trench features). For example, and as shown by reference number 470, different portions of contact mask 420 may include different configurations of trench features (e.g., shown as a gradient from dark gray to light gray) such that when contact mask 420 is used to form emitters 200 on wafer 105, the resulting emitters 200 formed from the different portions of contact mask 420 have different trench-to-trench distances, different mesa diameters, and/or the like to compensate for variations in an oxidation rate across wafer 105. Continuing with the previous example, the resulting emitter 200 may have current confinement apertures 210 with approximately the same diameter based on compensating for the variations in the oxidation rate across wafer 105 via the different configurations of trench features. In this way, contact mask 420, with different configurations of trench features across contact mask 420, may be used to compensate for variations in an oxidation rate across wafer 105.

In some implementations, contact mask 420 may have a gradient configuration of trench features. For example, trench features may vary across wafer 105 in a smooth manner rather than varying in a well-defined an isolated manner, as was the case with stepper mask 410. Continuing with the previous example, rather than having multiple distinct regions on contact mask 420 with differently configured trench features, contact mask 420 may have a smooth gradient of differently configured trench features (e.g., different distances of trench features) between a maximum value and a minimum value (e.g., a maximum trench-to-trench distance and a minimum trench-to-trench distance, a maximum mesa diameter and a minimum mesa diameter, and/or the like).

In some implementations, for both stepper mask 410 and/or contact mask 420, the configuration of trench features (e.g., the mask pattern of stepper mask 410 and/or contact mask 420) may be in a radial direction, in a north-south direction, in an east-west direction, in a non-uniform pattern or direction, and/or the like. For example, the configuration of trench features may depend on a process uniformity trend, such that a pattern of differences in a configuration of the trench features matches the process uniformity trend. In some cases, and with respect to stepper mask 410 specifically, a different configuration of trench features may be used for each step. In some implementations, stepper mask 410 and contact mask 420 may be combined into a single mask. For example, a sub-mask of stepper mask 410 may have a gradient pattern of trench features similar to that described with regard to contact mask 420.

As indicated above, FIG. 4 is provided merely as an example. Other examples are possible and may differ from what was described with regard to FIG. 4.

Figure 5:
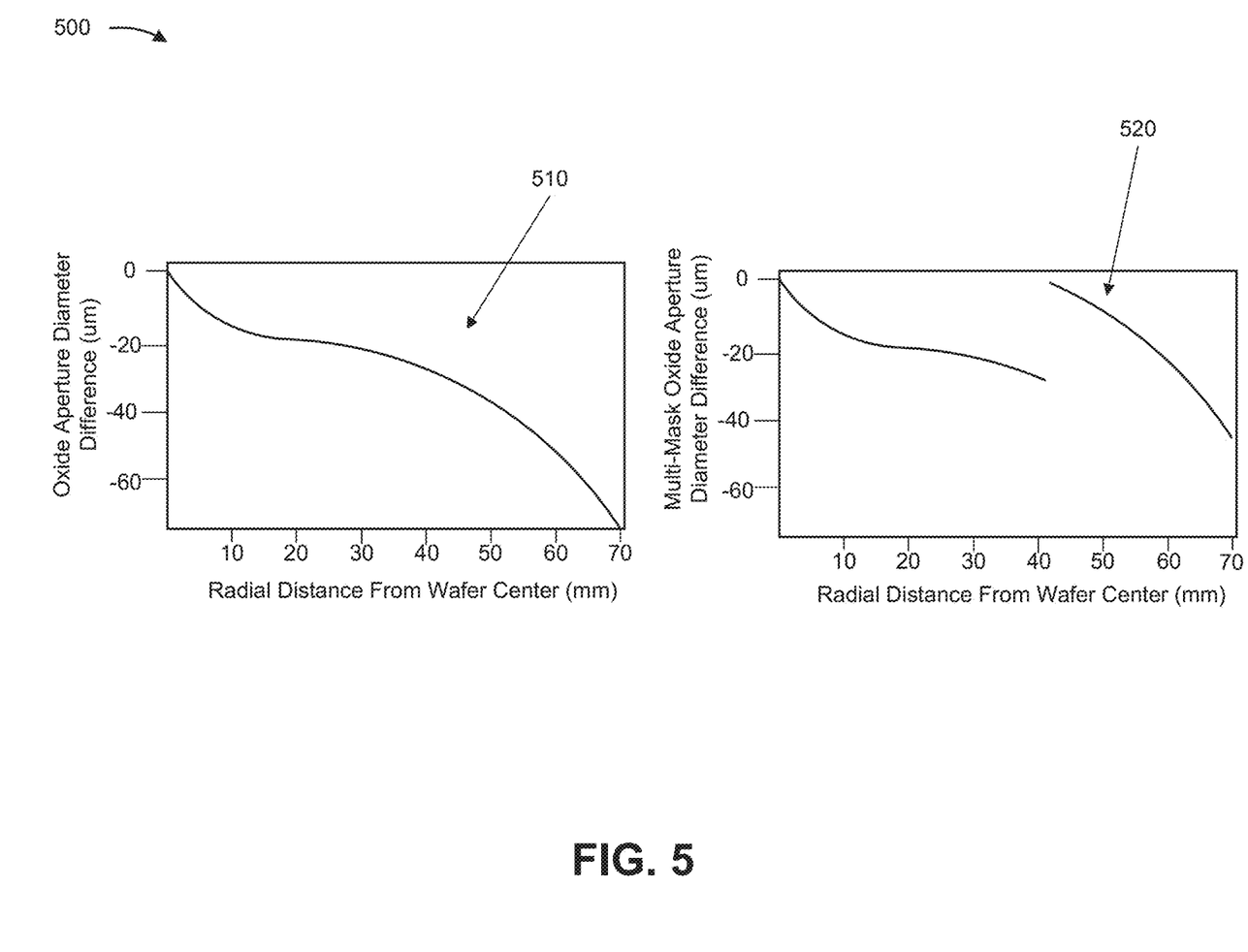
FIG. 5 is a diagram depicting example data related to an oxidation rate across a wafer.

FIG. 5 is a diagram 500 depicting example data related to an oxidation rate across a wafer. Reference number 510 shows example data of an oxide aperture (e.g., current confinement aperture 210) diameter difference moving radially outward from a center of wafer 105. In this example, the oxide aperture is larger at the center of wafer 105 and decreases moving towards the edge of wafer 105. In some implementations, the diameter difference may satisfy a threshold. For example, diameter differences that are equal to or greater than the threshold may cause optical output power from emitters 200 formed on wafer 105 to differ by an amount that satisfies a threshold (e.g., some emitters 200 may not lase at a needed optical output power).

In some implementations, this data may result from differences in an oxidation rate across wafer 105. For example, this data may be historical data aggregated for a particular furnace, for a particular manufacturer of wafer 105, and/or the like. In some implementations, this data may be used to determine a manner in which to vary trench features (e.g., a trench-to-trench distance, a mesa diameter, and/or the like) across wafer 105, such that the difference between oxide aperture diameters is within a threshold.

Reference number 520 shows example data related to using two different stepper masks 410 with different configurations of trench features (or contact mask 420 with two different configurations of trench features). For example, the data shown with respect to reference number 520 may be data gathered after compensating for variations in an oxidation rate across wafer 105 in the manner described herein. As further shown by reference number 520, the trench-to-trench distance is increased slightly for emitters 200 closer to the edge of wafer 105 to compensate for an increased oxidation rate at corresponding locations on wafer 105. This reduces the total variation in the oxide aperture diameter across wafer 105. For example, compared to the data shown with respect to reference number 510, which shows a diameter difference range across wafer 105 of approximately 70 microns, the data shown with respect to reference number 520 shows a diameter difference range of approximately 50 microns across wafer 105. This reduces a variability in performance of emitters 200 formed from the same wafer 105, thereby compensating for variations in an oxidation rate across wafer 105.

As indicated above, FIG. 5 is provided merely as an example. Other examples are possible and may differ from what was described with regard to FIG. 5.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A mask, comprising:
    a plurality of sub-masks having trench features associated with forming a plurality of trenches for vertical cavity surface emitting lasers (VCSELs) on or within a wafer,
        wherein, for each sub-mask of the plurality of sub-masks, a distance between the trench features of the sub-mask is constant, and
        wherein the distance between the trench features of at least one sub-mask, of the plurality of sub-masks, is different from the distance between the trench features of one or more other sub-masks, of the plurality of sub-masks, based on a predicted variation in an oxidation rate of an oxidation layer associated with the wafer.

2. The mask of claim 1, wherein the trench features across the plurality of sub-masks are configured to compensate for the predicted variation in the oxidation rate.

3. The mask of claim 1, wherein the at least one sub-mask and the one or more other sub-masks are associated with forming different subsets of VCSELs, of the plurality of VCSELs, that have mesa structures of different diameters.

4. The mask of claim 1, wherein the at least one sub-mask and the one or more other sub-masks are associated with forming different subsets of VCSELs, of the plurality of VCSELs, that have different trench-to-trench diameters.

5. The mask of claim 1, wherein the mask is divided into a plurality of steps associated with a respective sub-mask of the plurality of sub-masks.

6. The mask of claim 1, wherein the plurality of sub-masks is associated with causing a trench-to-trench distance of a mesa structure associated with the plurality of VCSELs to vary across the wafer.

7. The mask of claim 1, wherein the plurality of sub-masks is to be used to form different subsets of VCSELs, of the plurality of VCSELs, on or within different portions of the wafer.

8. A mask, comprising:
    a plurality of trench features associated with forming a plurality of trenches for vertical cavity surface emitting lasers (VCSELs) on or within a wafer,
        wherein a distance between the plurality of trench features varies across the mask based on a predicted variation in an oxidation rate of an oxidation layer associated with the wafer.

9. The mask of claim 8, wherein the distance between the plurality of trench features is configured to vary a trench-to-trench distance between the plurality of VCSELs based on the predicted variation in the oxidation rate.

10. The mask of claim 8, wherein the distance between the plurality of trench features is configured to vary a diameter of a respective mesa structure between the plurality of VCSELs based on the predicted variation in the oxidation rate.

11. The mask of claim 8, wherein the mask is a contact mask.

12. The mask of claim 8, wherein the mask includes at least two configurations of trench features with different distances between the trench features.

13. The mask of claim 8, wherein the at least two configurations of trench features are associated with forming different sized trenches or mesa structures associated with the plurality of VCSELs on or within the wafer.

14. A method of forming an emitter array, comprising:
    forming an emitter array using a plurality of sub-masks having trench features associated with forming a plurality of trenches for vertical cavity surface emitting lasers (VCSELs) on or within a wafer,
        wherein, for each sub-mask of the plurality of sub-masks, a distance between the trench features of the sub-mask is constant, and
        wherein the distance between the trench features of at least one sub-mask, of the plurality of sub-masks, is different from the distance between the trench features of one or more other sub-masks, of the plurality of sub-masks, based on a predicted variation in an oxidation rate of an oxidation layer associated with the wafer.

15. The method of claim 14, wherein the trench features across the plurality of sub-masks are configured to compensate for the predicted variation in the oxidation rate.

16. The method of claim 14, wherein the at least one sub-mask and the one or more other sub-masks are associated with forming different subsets of VCSELs, of the plurality of VCSELs, that have mesa structures of different diameters.

17. The method of claim 14, wherein the at least one sub-mask and the one or more other sub-masks are associated with forming different subsets of VCSELs, of the plurality of VCSELs, that have different trench-to-trench diameters.

18. The method of claim 14, wherein the mask is divided into a plurality of steps associated with a respective sub-mask of the plurality of sub-masks.

19. The method of claim 14, wherein the plurality of sub-masks is associated with causing a trench-to-trench distance of a mesa structure associated with the plurality of VCSELs to vary across the wafer.

20. The method of claim 13, wherein the plurality of sub-masks is to be used to form different subsets of VCSELs, of the plurality of VCSELs, on or within different portions of the wafer.

\* \* \* \* \*